US010772236B2

(12) United States Patent
Zhang

(10) Patent No.: US 10,772,236 B2
(45) Date of Patent: Sep. 8, 2020

(54) HEAT DISSIPATION DEVICE AND METHOD, AND ELECTRONIC DEVICE

(71) Applicant: Lenovo (Beijing) Co., Ltd., Beijing (CN)

(72) Inventor: Guowen Zhang, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/452,886

(22) Filed: Jun. 26, 2019

(65) Prior Publication Data

US 2019/0394899 A1 Dec. 26, 2019

(30) Foreign Application Priority Data

Jun. 26, 2018 (CN) .......................... 2018 1 0671347

(51) Int. Cl.
| | |
|---|---|
| *H05K 7/20* | (2006.01) |
| *F28F 13/00* | (2006.01) |
| *H01L 23/427* | (2006.01) |
| *G06F 1/20* | (2006.01) |
| *H05K 5/03* | (2006.01) |

(52) U.S. Cl.
CPC .......... *H05K 7/2039* (2013.01); *F28F 13/00* (2013.01); *G06F 1/203* (2013.01); *H01L 23/4275* (2013.01); *H05K 5/03* (2013.01); *H05K 7/2029* (2013.01); *H05K 7/2049* (2013.01); *H05K 7/20454* (2013.01); *F28F 2013/005* (2013.01); *F28F 2255/02* (2013.01)

(58) Field of Classification Search
CPC ................................................. H01L 23/4275
See application file for complete search history.

(56) References Cited

U.S. PATENT DOCUMENTS

| | | | | |
|---|---|---|---|---|
| 3,620,212 | A * | 11/1971 | Fannon, Jr. ............. | A61F 6/142 |
| | | | | 128/839 |
| 7,484,735 | B2 * | 2/2009 | Verbrugge ............... | B60J 10/00 |
| | | | | 277/628 |
| 9,205,593 | B2 * | 12/2015 | Keefe ..................... | B29C 59/02 |
| 9,615,486 | B2 * | 4/2017 | De Bock ................. | H01L 23/42 |
| 10,448,540 | B2 * | 10/2019 | Hou ..................... | H01L 23/3735 |
| 2011/0308781 | A1* | 12/2011 | O'Riordan ......... | H05K 7/20454 |
| | | | | 165/185 |
| 2012/0293016 | A1* | 11/2012 | Schaefer ............. | H01M 10/482 |
| | | | | 307/117 |

(Continued)

FOREIGN PATENT DOCUMENTS

| | | |
|---|---|---|
| CN | 102548355 A | 7/2012 |
| CN | 105472950 A | 4/2016 |

(Continued)

*Primary Examiner* — Robert J Hoffberg
(74) *Attorney, Agent, or Firm* — Anova Law Group, PLLC

(57) ABSTRACT

A heat dissipation device for an electronic device is provided. The heat dissipation device comprises a heat conducting cover configured to be disposed on an electronic device, the heat conducting cover forming a closed cavity; and a heat absorbing material filler located within the closed cavity as defined by the heat conducting cover. With a temperature increase of the electronic device, the heat absorbing material filler is configured to deform structurally, to absorb heat generated by the electronic device.

16 Claims, 4 Drawing Sheets

(56) References Cited

U.S. PATENT DOCUMENTS

| | | | | |
|---|---|---|---|---|
| 2014/0158334 | A1* | 6/2014 | Dellea | G05D 23/028 |
| | | | | 165/185 |
| 2017/0315598 | A1* | 11/2017 | Voth | G06F 9/3844 |
| 2017/0321966 | A1* | 11/2017 | Lueckenbach | F23D 14/14 |
| 2018/0361167 | A1* | 12/2018 | De La Torre Barreiro | ............... |
| | | | | A61N 1/40 |
| 2019/0320550 | A1* | 10/2019 | Hou | H05K 7/2039 |

FOREIGN PATENT DOCUMENTS

| | | |
|---|---|---|
| CN | 105848449 A | 8/2016 |
| CN | 106102415 A | 11/2016 |

* cited by examiner

HEAT DISSIPATION DEVICE AND METHOD, AND ELECTRONIC DEVICE

CROSS-REFERENCES TO RELATED APPLICATIONS

This application claims priority of Chinese Patent Application No. 201810671347.7, filed on Jun. 26, 2018, the entire contents of which are hereby incorporated by reference.

FIELD OF THE DISCLOSURE

The present disclosure generally relates to the field of heat dissipation technology and, more particularly, relates to a heat dissipation device, a heat dissipation method, and an electronic device.

BACKGROUND

Nowadays, electronic devices have been widely used in thousands of households, such as notebook computers, various industrial computers, various household electrical appliances, and various wearable portable devices. These electronic devices provide great convenience for people's daily life, work, and entertainment.

However, as the functions of an electronic device increase, more and more electronic components are integrated into the electronic device, resulting in a large amount of heat generated by the electronic components during the operation of the electronic device. Even if an electronic device is provided with a heat dissipation device, during the high-power operation, the surface temperature of the electronic device housing is high, so that a user cannot comfortably touch the electronic device. Especially for an electronic device worn on the body part of a user, the sudden increase of the surface temperature of the electronic device housing prevents the user from continuing to wear the electronic device. The purpose of wearing the electronic devices cannot be achieved.

The disclosed methods and systems are directed to solve one or more problems set forth above and other problems.

BRIEF SUMMARY OF THE DISCLOSURE

One aspect of the present disclosure provides a heat dissipation device for an electronic device. The heat dissipation device comprises a heat conducting cover configured to be disposed on an electronic device, the heat conducting cover forming a closed cavity; and a heat absorbing material filler located within the closed cavity as defined by the heat conducting cover. In response to a temperature increase of the electronic device, the heat absorbing material filler is configured to deform structurally, to absorb heat generated by the electronic device.

Another aspect of the present disclosure provides an electronic device. The electronic device comprises a housing, a heating element disposed within the housing, and a heat dissipation device disposed in the housing. The heat dissipation device comprises a heat conducting cover disposed on the heating element, the heat conducting cover forming a closed cavity; and a heat absorbing material filler located within the closed cavity as defined by the heat conducting cover. In response to an increase in temperature of the heating element, the heat absorbing material filler is configured to deform structurally, to absorb heat generated by the heating element.

Another aspect of the present disclosure provides a heat dissipation method for an electronic device. The method includes disposing a heat dissipating device on the electronic device; and the heat dissipating device deforming structurally, in response to heat generated by the electronic device, to absorb the heat generated from the electronic device.

Other aspects of the present disclosure can be understood by those skilled in the art in light of the description, the claims, and the drawings of the present disclosure.

BRIEF DESCRIPTION OF THE DRAWINGS

To more clearly illustrate the technical solutions of this disclosure, the accompanying drawings will be briefly introduced below. Obviously, the drawings are only part of the disclosed embodiments. Those skilled in the art can derive other drawings from the disclosed drawings without creative efforts.

DETAILED DESCRIPTION

During a high-power operation of an electronic device, the surface temperature of the electronic device housing is relatively high, which does not hinder the user's continued use of the electronic device that a user does not need to make contact with. But for the electronic device that the user needs to make contact with, especially the electronic device worn by the user, the heat dissipation capability is usually not desired, and the surface temperature of the electronic device housing is not paid much attention to. During the long-term contact of the user's body part with the housing surface of the electronic device, the increase of the housing temperature inevitably affects the user's comfort in contacting the surface of the electronic device housing.

In order to improve the above problem, the present inventors propose to delay the temperature increase of the surface of the electronic device housing, that is, to realize the control of the surface temperature of the electronic device housing, such that the surface temperature of the housing does not increase too much during the high-power operation to cause that the surface temperature of the housing is too high.

The above described objects, features, and advantages of the present disclosure will be more clearly understood from the following description of the embodiments of the disclosure. Obviously, the embodiments to be described are only part not all of the embodiments. All other embodiments obtained by those skilled in the art according to the disclosed embodiments of the present disclosure without creative efforts are within the scope of the present disclosure.

Figure 1:
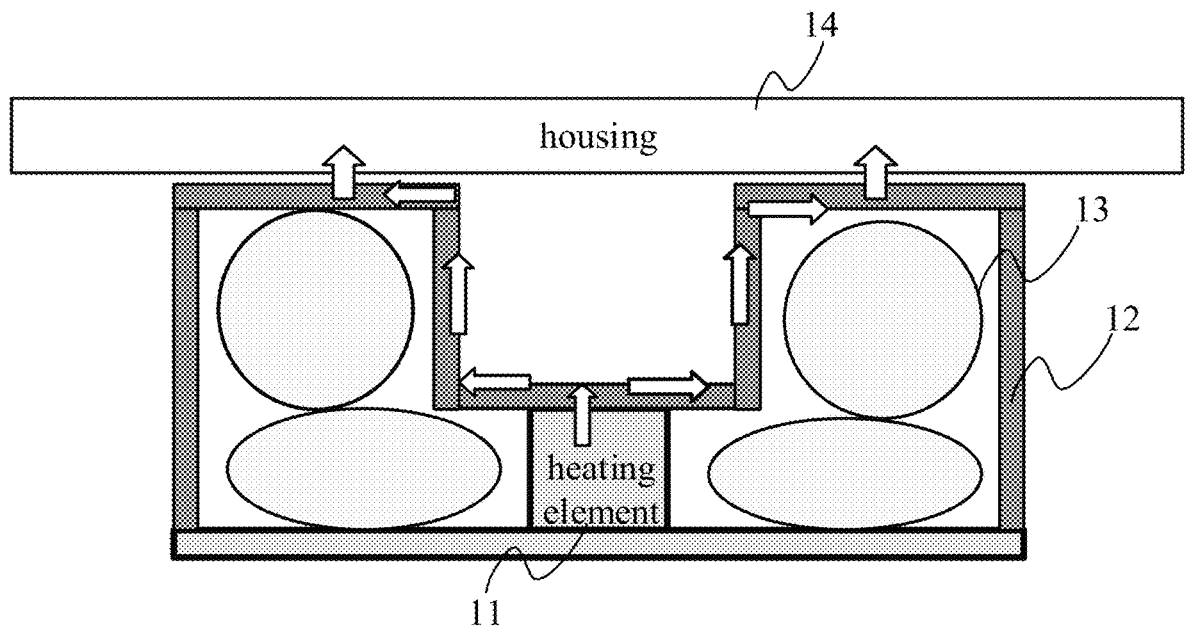
FIG. 1 illustrates a structural diagram of a heat dissipation device consistent with the disclosed embodiments.
Figure 2:
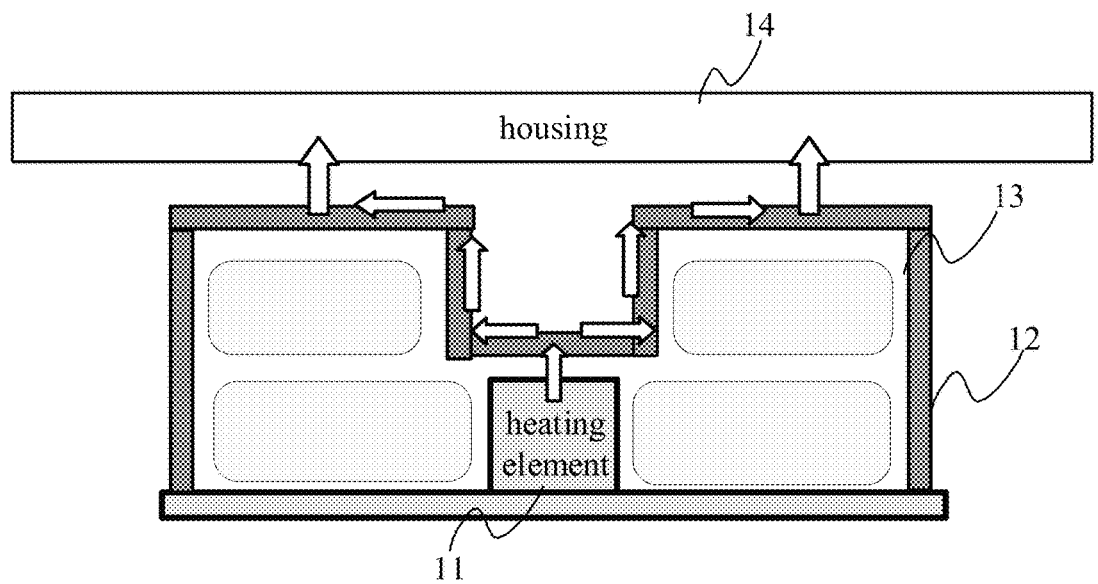
FIG. 2 illustrates a structural diagram of another heat dissipation device consistent with the disclosed embodiments.
Figure 3:
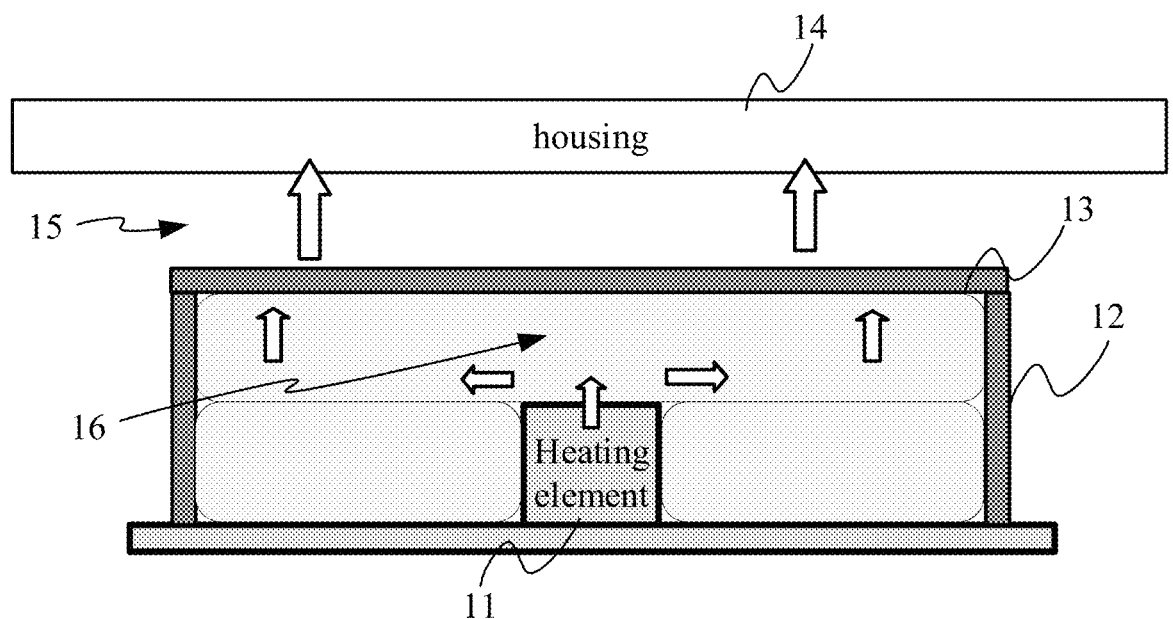
FIG. 3 illustrates a structural diagram of another heat dissipation device consistent with the disclosed embodiments.

FIG. 1, FIG. 2, and FIG. 3 illustrate structural diagrams of a heat dissipation device consistent with the disclosed embodiments. The heat dissipation device may be applied to electronic devices, especially electronic devices worn by a user, such as smart watches, wristbands, eyeglasses and the like. The heat dissipation device provided by the embodiments can be applied to other types of electronic devices, such as mobile phones, tablet computers, and the like. The product type of the electronic device is not limited in the present disclosure.

In one embodiment, the heat dissipation device may comprise, but not limited to, the following components: a heating element 11, and a heat conducting cover 12 disposed on the heating element 11 of the electronic device to form a closed cavity, and one or more heat absorbing material fillers (such as phase-change-energy-storage material fillers) 13 located in the closed cavity.

The heat dissipation device can be deformed as the surface temperature of the housing 14 of the electronic device increases (or simply as the temperature of the electronic device increases), such that the heat absorbing material fillers or the phase-change-energy-storage material fillers 13 adhere to or contact with the heating element 11, absorb heat generated by the heating element 11, and save at least part of the absorbed heat.

In practical applications, the temperature of the electronic device (e.g., the surface temperature of the electronic device housing, the temperature of the housing of the electronic device, the temperature of the heating element, etc.) can be detected in real time or periodically by using a temperature detector in the electronic device. Using the surface temperature of the housing as an example, when the difference between the surface temperature of the housing and the warning threshold (the difference=warning threshold−the surface temperature of the housing) reaches the preset value, the alarm information can be outputted by means of voice broadcast, buzzer, and the like, to remind a user to take off the electronic device that is worn, so as to avoid that the temperature of the electronic device housing is too high to reduce the comfort of the contact temperature of the electronic device. It should be noted that, the specific values of the foregoing warning threshold and preset value are not limited herein.

During the use of the electronic device, after the surface temperature of the housing is increased, the heat dissipation device is deformed, and the heat dissipation device is changed from the current shape to a preset shape. Accordingly, the shape of the closed cavity of the heat conducting cover 12 is changed, such that the phase-change-energy-storage material fillers 13 in the closed cavity can continuously approach the heating element 11 during the phase change to increase the absorption efficiency of the phase-change-energy-storage material fillers 13 for absorbing heat generated by the heating element 11 and further increase heat dissipation efficiency.

Since the phase-change-energy-storage material fillers 13 store the absorbed heat, heat transferred to the heat conducting cover is reduced, and heat transferred to the housing through the air is reduced, thereby avoiding that the temperature inside the electronic device housing gets significantly high, such that the surface temperature of the housing increases rapidly. The temperature control of the surface of the housing is realized.

In one embodiment, the heat conducting cover 12 may be used to raise the temperature of the housing of the electronic device to a first threshold. The first shape (the shape of the heat conducting cover shown in FIG. 1, but is not limited thereto) is deformed to be the second shape (the form of the heat conducting cover shown in FIG. 3, but is not limited thereto). The housing temperature decreases to the second threshold, and the second shape is restored to the first shape. If the heat conducting cover 12 is in the first shape, the phase-change-energy-storage material fillers 13 may not adhere to the heating element 11. If the heat conducting cover 12 is in the second shape, the phase-change-energy-storage material fillers 13 adhere to the heating element 11.

In combination with shape changes of the heat conducting cover shown in FIG. 1, FIG. 2 and FIG. 3, the heat conductive material constituting the heat conducting cover 12 can be deformed when the temperature of the heat conducting cover 12 reaches a certain value. The first threshold value is the critical temperature value at which the material is deformed. For the deformable heat conductive material, the critical value of the deformation may be different, that is, the first threshold is different. The specific value of the first threshold is not limited in the embodiment.

In one embodiment, when the heat conducting cover 12 is in the first shape (as shown in FIG. 1), the heat conducting cover 12 is in contact with the housing 14 of the electronic device, such that the heat conducting cover can efficiently transfer heat to the housing 14 for heat dissipation. If the heat conducting cover 12 (as shown in FIG. 3) is in the second shape, there is a gap 15 between the heat conducting cover 12 and the housing 14 of the electronic device. In practical applications of the embodiment, in the deformation process between the first shape and the second shape, the heat conducting cover 12 is usually unable to directly contact the housing, and a gap is usually formed. Heat is transferred by the air in the gap.

Optionally, when the heat conducting cover 12 is in the first shape, the heat conducting cover 12 can be in contact with the heating element to improve heat transfer efficiency, that is, to improve heat dissipation performance of the heat dissipation device. In practical applications, the positional relationship between the heat conducting cover 12 and the heating element is not limited to the positional relationship described above. There may be a certain gap between the heat conducting cover 12 and the heating element. But the gap usually affects heat dissipation performance.

When the heat conducting cover 12 is in the second shape, the heat conducting cover 12 is not in contact with the heating element 11 (there is a gap 16 between the heat conducting cover 12 and the heating element 11, as shown in FIG. 3), but the heat transfer is realized by the phase-change-energy-storage material filler 13. The specific implementation process can be referred to the description of the following embodiments. Moreover, in the deformation process between the first shape and the second shape, the heat conducting cover 12 is generally no longer in contact with the heating element 11.

In one embodiment, the heat conducting cover may be made of a heat conductive shape-memory material. Shape-memory material is a new type of material with a shape-memory effect that combines sensing and driving. That is, after a plastic deformation of a solid material with a certain shape in a low temperature state (such as the foregoing first shape after deformation), when the material is heated above the critical temperature inherent in the material, the material restores to its original shape (such as the foregoing second shape).

In practical applications, shape-memory effects of the shape-memory material can be divided into a one-way shape-memory effect, a two-way shape-memory effect, and a full-range shape-memory effect. In one embodiment, a shape-memory material with a two-way shape-memory effect can be adopted to make the heat conducting cover 12. The shape-memory material with a two-way shape-memory effect can spontaneously and reversibly recover high and low temperature corresponding shapes by temperature increase and decrease, such as the deformation process of the heat conducting cover described above between the first shape and the second shape. Materials with other shape-memory effects can also be adopted to make the heat conducting cover according to actual requirements. The present disclosure only use the shape-memory material with a two-way shape-memory effect to make the heat conducting cover 12 as an example for illustrative purposes.

The material for making the heat conducting cover 12 may specifically be a Shape Memory Alloys (SMA). When the temperature of the heat conducting cover is raised to reach a deformation critical temperature value (which can be recorded as a deformation temperature), the folded heat conducting cover is naturally deployed in a preset form due to the "memory" function. When the temperature is decreased to reach the critical temperature of the deformation recovery, the deployed heat conducting cover will be re-contracted and folded into the initial state. It should be noted that the present disclosure does not limit the specific material for making the heat conducting cover and the preset memory shape for deformation. The shapes, not limited to the shapes shown in FIG. 1, FIG. 2 and FIG. 3, may be determined according to the shape characteristics of the heating element, and the space shapes of the heating element and the electronic device housing.

In one embodiment, the phase-change-energy-storage material filler 13 is actually a phase change material (PCM), which refers to a substance that changes the shape of a material and provides latent heat as the temperature changes. A process that changes the physical properties is called a phase change process when the phase change material absorbs or releases a large amount of latent heat. It can be seen that the phase change material has the ability to change its physical state within a certain temperature range.

For example, the physical state change can be the solid-liquid phase change. When a phase change material is heated to the melting temperature, the phase change from the solid state to the liquid state occurs. In the melting process, the phase change material absorbs and stores a large amount of latent heat. When the phase change material cools, the stored heat is released into the environment within a certain temperature range, and the reverse phase change from liquid to solid occurs. When the physical state changes, the temperature of the material itself remains almost unchanged until the phase change is completed, forming a wide temperature equilibrium. Although the temperature is constant, the latent heat absorbed or released may be significantly large.

Accordingly, in one embodiment, a phase change material is used as a filler, that is, the phase-change-energy-storage material filler 13, which is disposed in the closed cavity in the heat conducting cover 12. As the analysis of the operation principle of a phase change material described above, during the operation of an electronic device, when the power consumption is high, the temperature around the heating element is usually very high. When a critical temperature range in which the phase change material undergoes a phase change is reached, the phase-change-energy-storage material fillers 13 undergo the phase change. At this time, since the critical phase change temperature range of the phase change material is usually higher than the critical temperature value at which the heat conducting cover is deformed. The heat conducting cover is usually already deformed before the phase-change-energy-storage material fillers 13 undergo the phase change. As shown in FIG. 2 and FIG. 3, during the phase change process, the phase-change-energy-storage material fillers 13 undergo a physical state transition, and continuously approaches the heating element to improve the absorption efficiency of heat generated by the heating element to avoid that heat is directly transferred to the electronic device housing to cause an excessive surface temperature.

The physical state change of the phase-change-energy-storage material filler 13 may be changed according to the shape change of the closed cavity of the heat conducting cover, and gradually fills the entire closed cavity. The shapes of the phase-change-energy-storage material filler 13 and the heat conducting cover 12 are shown in FIG. 3, but are not limited thereto.

In practical applications, the phase change materials for making the phase-change-energy-storage material filler 13 can be classified into organic and inorganic phase change materials, and can also be classified into hydrated salt phase change materials, waxy phase change materials, and the like. The specific composition of the phase-change-energy-storage material filler 13 is not limited in the embodiment. For example, the phase-change-energy-storage material filler 13 is made of a waxy phase change material, which has the foregoing solid-liquid phase change process in practical applications. For other phase change materials, phase change between other different physical states may occur, and is not limited to the phase change process described herein.

According to the above analysis, when the electronic device operates in a low power mode, heat generated by the heating element is relatively small. The temperature inside the electronic device housing is usually not sufficiently high to reach the critical temperature at which the heat conducting cover is deformed, and the heat dissipation device maintains the state shown in FIG. 1. In this case, heat generated by the heating element is directly transferred to the heat conducting cover 12 which contact with the heating element, and is transferred to the electronic device housing by the heat conducting cover 12 for heat dissipation. The arrow in FIG. 1 may illustrate the heat transfer path. The thermal resistance is small, and heat generated by the heating element can be effectively transferred to the outer housing for heat dissipation, thereby ensuring the operating safety and stability of the chips inside the electronic device and the comfort of the outer surface temperature of the electronic device housing.

When the electronic device operates in a high-power mode, heat generated by the heating element contained therein increases, such that the ambient temperature of the electronic device increases. That is, the temperature of the environment in which the heat dissipation device is located increases to reach the critical temperature value for the deformation of the heat conducting cover. The heat conducting cover is deformed according to "memory", from the first shape to the second shape. When the ambient temperature of the electronic device increases to reach the phase change temperature range of the phase-change-energy-storage material fillers 13, as the process shown in FIG. 1 to FIG. 3, the phase-change-energy-storage material fillers 13 undergo the phase change until the heat conducting cover is deformed into the second shape. At this time, the phase-change-energy-storage material fillers 13 fill the entire closed cavity, to reach the adherent state from the non-adherent state with the heating element. That is, the phase-change-energy-storage material fillers 13 contact the heating element to improve the heat absorption efficiency of the phase-change-energy-storage material filler 13.

As shown in FIG. 3, during the operation in the high power mode of the electronic device, the heat transfer path generated by the heating element as the path shown by the arrow shown in FIG. 3 will change, heat generated by the heating element is transferred to the phase-change-energy-storage material fillers 13 to store part of the heat and transfer other part of the heat to the heat conducting cover. Further, the heat is transferred to the housing through the air between the heat conducting cover and the electronic device housing for heat dissipation. In the state shown in FIG. 3, the thermal resistance between the heat conducting cover and the heating element becomes large, and there is a gap between the heat conducting cover and the electronic device housing, such that the temperature difference between the outer surface of the housing and the heating element becomes larger. Because of the heat absorption of the phase change material, the time for raising the outer surface temperature of the electronic device housing is greatly delayed. The temperature of the outer surface of the housing can be stabilized within a range without increasing immediately, to avoid that heat is directly transferred to the housing to results in excessive temperature on the outer surface of the housing.

In practical applications, an electronic device does not always operate in the high-power mode. When the operating power of the electronic device is gradually reduced, the operation is changed from a high-power mode to a low power mode such as a low load mode operation or a standby. In a low power mode, heat generated by the heating element is greatly reduced, such that the internal temperature of the electronic device decreases, that is, the ambient temperature of the heat conducting cover 12 and the phase-change-energy-storage material fillers 13 decreases. According to the path shown in FIG. 3, heat transferred to the electronics housing is greatly reduced, and the temperature of the outer surface of the housing is reduced accordingly. When the temperature of the environment in which the heat dissipation device is located decreases to the critical temperature at which the heat conducting cover recovers the deformation (which can be recorded as the recovery temperature), the heat conducting cover is gradually deformed from the second shape toward the first shape. The thermal resistance between the heating element and the electronic device housing becomes smaller. In the deformation process, the phase-change-energy-storage material fillers 13 can gradually release the previously stored heat, and heat is transferred through the heat conducting cover to the electronic device housing for heat dissipation Therefore, if the outer surface temperature of the housing is not too high, heat stored in the phase-change-energy-storage material fillers 13 is released, so as to store heat for the next high-power operation.

In one embodiment, in the case where the heating element generates a large amount of heat, the phase-change-energy-storage material filler 13 stores part of heat, transfers part of heat, and avoids that all the heat is transferred to result in excessive temperature of the electronic device housing. In the case where the heating element generates less heat, heat stored in the phase-change-energy-storage material fillers 13 is released in order to use the phase-change-energy-storage material fillers 13 for subsequent recycling. But the process of releasing heat does not cause the surface temperature of the housing to be high. The heat dissipation device provided by one embodiment can ensure that the surface temperature of the housing is not too high in various operating states of the electronic device, and the effective control of the surface temperature of the housing is realized.

In one embodiment, since the concern is whether the housing temperature increases or not, a large number of tests can be conducted to predetermine the internal temperature of the electronic device, that is, the ambient temperature of the heat dissipation device. The corresponding housing surface temperature at which the heat conducting cover 12 is deformed is the first threshold and is recorded. The corresponding surface temperature of the housing at which the phase-change-energy-storage material fillers 13 undergo a phase change is the second threshold and is recorded. The deformation of the heat conducting cover 12 in the heat dissipation device and the phase change of the phase-change-energy-storage material filler 13 can be known by monitoring the temperature of the surface of the housing. The specific implementation method for determining the first threshold and the second threshold is not limited in this embodiment.

In one embodiment, as shown in FIG. 1, the first shape of the heat conducting cover 12 may be in a concave shape (e.g., a 凹 shape), and the concave surface of the heat conducting cover 12 faces the housing 14 of the electronic device. The heating element 11 is located in the intermediate position of the closed cavity of the heat conducting cover 12. The phase-change-energy-storage material fillers 13 are located at both ends of the concave cavity of the heat conducting cover 12. The second shape is a rectangular mouth shape (e.g., a □ shape), and the phase-change-energy-storage material filler 13 can fill the closed cavity of the current heat conducting cover.

In combination with the description of the heat dissipation process of the heat dissipation device in the above embodiment, when an electronic device operates in the high-power mode, a large amount of heat generated by the heating element causes the temperature of the environment where the heat dissipation device is located to reach the deformation temperature of the heat conducting cover 12. The middle portion of the frame constituting the heat transfer cover is raised upward, and both ends and sides are contracted toward the heat generating element side, such that the phase-change-energy-storage material fillers 13 gradually fill the closed cavity in the entire frame. When the temperature of the environment in which the heat dissipation device is located decreases to the deformation recovery temperature of the heat conducting cover 12, the heat conducting cover 12 can be deformed according to the reverse process of the deformation, and restored from the first shape to the second shape.

It should be noted that, in one embodiment, the specific shapes of the first and second shapes of the heat conducting cover, and the specific physical state of the phase-change-energy-storage material filler 13 are not limited, and may be determined according to actual needs. Moreover, in one embodiment, a heat conducting cover may be disposed for each heating element, and a heat conducting cover may be disposed for a plurality of heating elements in a concentrated manner. The arrangement needs to be determined according to the layout of each chip or heating element in the electronic device.

In addition, in practical applications, the ambient temperature causing the phase-change-energy-storage material filler 13 to undergo a phase change may be a temperature range. That is, when the temperature of the environment in which the phase-change-energy-storage material fillers 13 are located falls within the temperature range, the phase-change-energy-storage material filler 13 can undergo a phase change. Moreover, in general, the lowest temperature in the temperature range is usually also not lower than the deformation temperature at which the heat conducting cover is deformed. That is, the phase change temperature is not less than the deformation temperature. The phase change temperature of the phase-change-energy-storage material filler and the deformation temperature of the heat conducting cover are generally greater than the high-power housing temperature of the electronic device. The high-power housing temperature is a temperature of the electronic device housing when the operating power consumption of the electronic device is greater than the power consumption threshold, that is, the surface temperature of the housing when the electronic device operates in a high-power mode.

Figure 4:
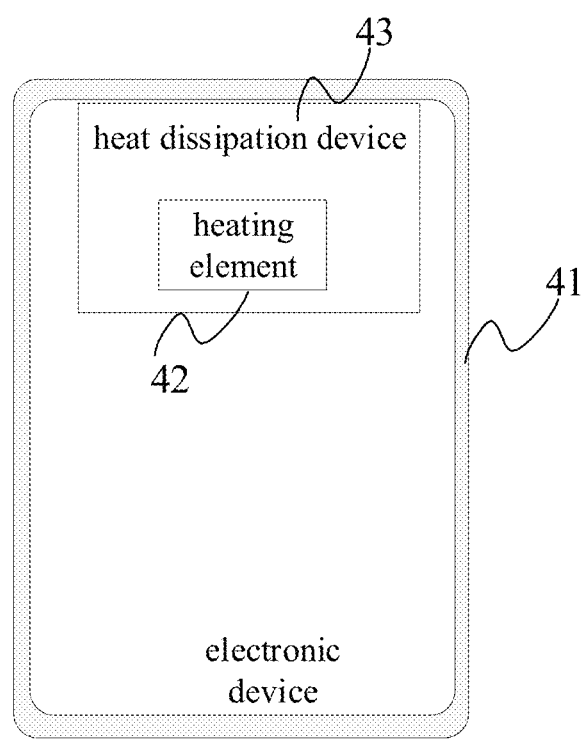
FIG. 4 illustrates a structural diagram of an electronic device consistent with the disclosed embodiments.

Referring to FIG. 1, FIG. 2, and FIG. 3, FIG. 4 illustrate a structural diagram of an electronic device consistent with the disclosed embodiments. As shown in FIG. 4, the electronic device may include a housing 41, a heating element 42, and a heat dissipation device 43. The housing 41 refers to the outer housing of the electronic device, which is the supporting shell of the entire electronic device, plays a role of positioning and fixing the electronic components in the electronic device, carries and limits all other non-housing components, and the like.

When a user uses an electronic device, the user's body part usually needs to contact the outer surface of the housing 41, especially for electronic devices worn by the user, such as smart watches, smart bracelets, smart gloves, smart glasses, or the like. When the user wears the electronic device, the user's skin always touches the outer surface of the housing 41 of the electronic device, and the user directly feels the surface temperature of the housing. If the surface temperature of the housing is too high, the comfort of the user using the electronic device will be greatly reduced, and even the electronic device can no longer be worn, such that the electronic device cannot perform its original functions.

It should be noted that the material of the housing 41 for making the electronic device is not limited in this embodiment. The plastic material with corresponding properties such as PC (Polycarbonate), engineering plastic ABS, PC+ABS (engineering plastic alloy) can be selected according to actual needs.

The heating element 42 may be disposed in the housing 41, and may specifically refer to an electronic component disposed on the main board of the electronic device. The heating element generates heat during operation of the electronic device, such that the temperature inside the electronic device housing increases and, the surface temperature of the electronic device housing increases.

In practical applications, there are many types of the heating elements 42. The heating elements of the electronic devices may be different in different operating modes of the electronic devices. In the same operating mode, the heating elements of the electronic devices of different structures may also be different. The present disclosure does not limit the specific electronic components as the heating elements. Generally, the processor or the controller chip that plays the core control generates more heat. In many operating modes of most electronic devices, both the processor and the controller chip can be used as heating elements.

In one embodiment, after a plurality of tests, it is determined that when the current electronic device is in each operation mode, the electronic components that generate more heat in the electronic device are used as heating elements. For the determined one or more heating elements, the heat dissipation devices described in the above embodiment are disposed. Accordingly, the situation that in a high-power operation, a large amount of heat generated by the heating element is directly transferred to the electronic device housing to cause a high surface temperature of the housing is avoided.

The heat dissipation device 43 can also be disposed in the housing 41. The specific structure of the heat dissipation device 43 can be referred to the structure described with respect to the heat dissipation device.

In practical applications, the number of the heating elements 42 and the heat dissipation devices 43 may be at least one. The positional relationship between the heat dissipation device 43 and the heating element may be determined according to actual conditions. For example, each heating element 42 is provided with a heat dissipation device 43 or a plurality of heating elements share a heat dissipation device 43.

During the use of the electronic device, especially when it is operated in a high-power mode, the heating element 42 generates a large amount of heat. At this time, the heat dissipation device is in a high temperature environment, and deformation occurs. That is, the heat conducting cover is deformed toward the "memory" form. The phase-change-energy-storage material fillers in the closed cavity of the heat shield will also undergo a phase change until the phase-change-energy-storage material fillers fill the entire closed cavity. The phase-change-energy-storage material fillers contact the inner surface of the entire frame of the heat conducting cover and approach or contact the heating element 42. At this time, the heating element 42 is no longer directly in contact with the heat conducting cover. Heat generated by the heating element 42 is transferred to the housing for heat dissipation through the phase-change-energy-storage material fillers and the heat conducting cover. Heat transferred to the phase-change-energy-storage material filler is partially absorbed and stored to reduce heat transferred backwards, thereby avoiding that heat generated by the heating element 42 is completely transferred to the housing to result in a high surface temperature of the housing.

After the electronic device ends the high power operation, heat generated by the heating element 42 is greatly reduced, and the phase-change-energy-storage material fillers release part of the stored heat through the heat conducting cover to the housing, such that the surface temperature of the electronic device housing does not decrease immediately, and is not too high, which ensures that when the electronic equipment operates in various modes, the surface temperature of the housing is within a controllable range, and avoid the excessive surface temperature of the housing to bring temperature discomfort for a user wearing the electronic device.

Figure 5:
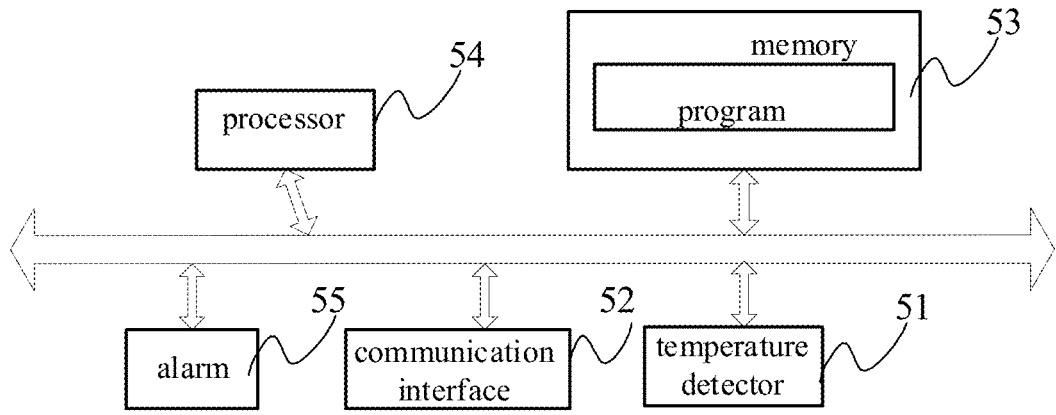
FIG. 5 illustrates a hardware structural diagram of an electronic device consistent with the disclosed embodiments.

FIG. 5 illustrates a hardware structure diagram of an electronic device consistent with the disclosed embodiments. The electronic device can implement monitoring of the surface temperature of the housing. As shown in FIG. 5, the electronic device may include, but not limited to, a temperature detector 51, a communication interface 52, a memory 53, a processor 54, and an alarm 55.

The temperature detector 51 detects the temperature inside the housing of the electronic device, specifically the temperature around the heating element, and send the detected temperature (temperatures referred to herein are temperature values) to the memory 53 for storage through the communication interface 52. The memory 53 can also store a program for implementing the calculation and monitoring of temperature of the electronic device housing, such that the processor 54 loads and executes the program, to realize the calculation and monitoring of the temperature of the electronic device housing. When the difference between the surface temperature of the electronic device housing and the warning threshold reaches a preset value, the alarm 55 is timely controlled to present an alarm.

Specifically, the surface temperature of the housing can be calculated according to the detected temperature and the current thermal resistance. The specific calculation method is not limited herein. Further, the difference between the surface temperature of the housing and the warning threshold can be determined to reach the preset value or not in real time or periodically. If the difference reaches the preset value, which means the surface temperature of the housing is going to increase to the warning threshold, a control command may be sent to the alarm to control the alarm to output a corresponding alarm message to remind a user wearing the electronic device the surface temperature of the housing is going to increase to the warning threshold. The alarm may be in sound beeps, voice, text, email, or other appropriate forms.

In one embodiment, the surface temperature of the housing can be directly detected by a temperature detector, and is not limited to calculating the surface temperature of the housing by the internal environment temperature given above. The monitoring alarm for the temperature of the housing is similar to the method described above.

It should be noted that the structure of an electronic device with the heat dissipation device provided by the present disclosure is not limited to the components listed above, and may be determined according to the product type and requirements of the electronic device.

Figure 6:
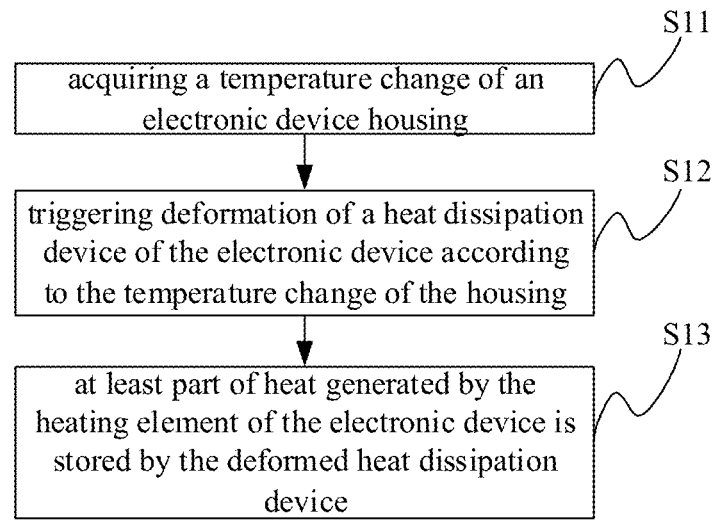
FIG. 6 illustrates a flowchart of an heat dissipation method consistent with the disclosed embodiments.

In conjunction with FIG. 1, FIG. 2 and FIG. 3, FIG. 6 is a flowchart of a heat dissipation method consistent with the disclosed embodiments. The method may be applied to electronic devices. The structure of the electronic device can be referred to the description of the above electronic device. As shown in FIG. 6, the heat dissipation method provided in one embodiment may include the followings.

S11: acquiring a temperature change of an electronic device (e.g., of the electronic device housing or of a surface of the electronic device housing).

In combination with the above description, the electronic device may determine the temperature or surface temperature change of the electronic device housing according to the temperature detected by the temperature detector in the electronic device. The method for acquiring the temperature of the housing may be a direct detection method realized by a temperature detector provided on the housing, or may be an indirect detection method realized by a temperature detector provided in the housing (for example, calculating the housing temperature from the internal temperature first, and then determining the temperature change of the housing), it is not intended to limit the way in which the temperature change of the housing is acquired.

S12: triggering deformation of a heat dissipation device of the electronic device according to the temperature change of the electronic device;

In the practical applications of one embodiment, the heat dissipation device of the electronic device is actually deformed by the temperature of the environment in which heat dissipation device is located. The temperature change of the environment represents the temperature change of the housing. Or the temperature change of the housing also represents the temperature change of the environment in which the heat dissipation device is located. The temperature change of the housing is consistent with the temperature change of the environment in which the heat dissipation device is located. For the deformation process of the heat dissipation device, reference may be made to the description of the heat dissipation device.

S13: at least part of heat generated by the heating element of the electronic device is stored by the deformed heat dissipation device.

When the electronic device is operated in a high-power mode, the heat dissipation device is deformed, such that the phase-change-energy-storage material fillers contained therein contacts the heating element, absorbs and stores heat generated by the heating element, and avoids that all the heat generated by the heating element is directly transferred to the housing to cause an excessive housing temperature.

Figure 7:
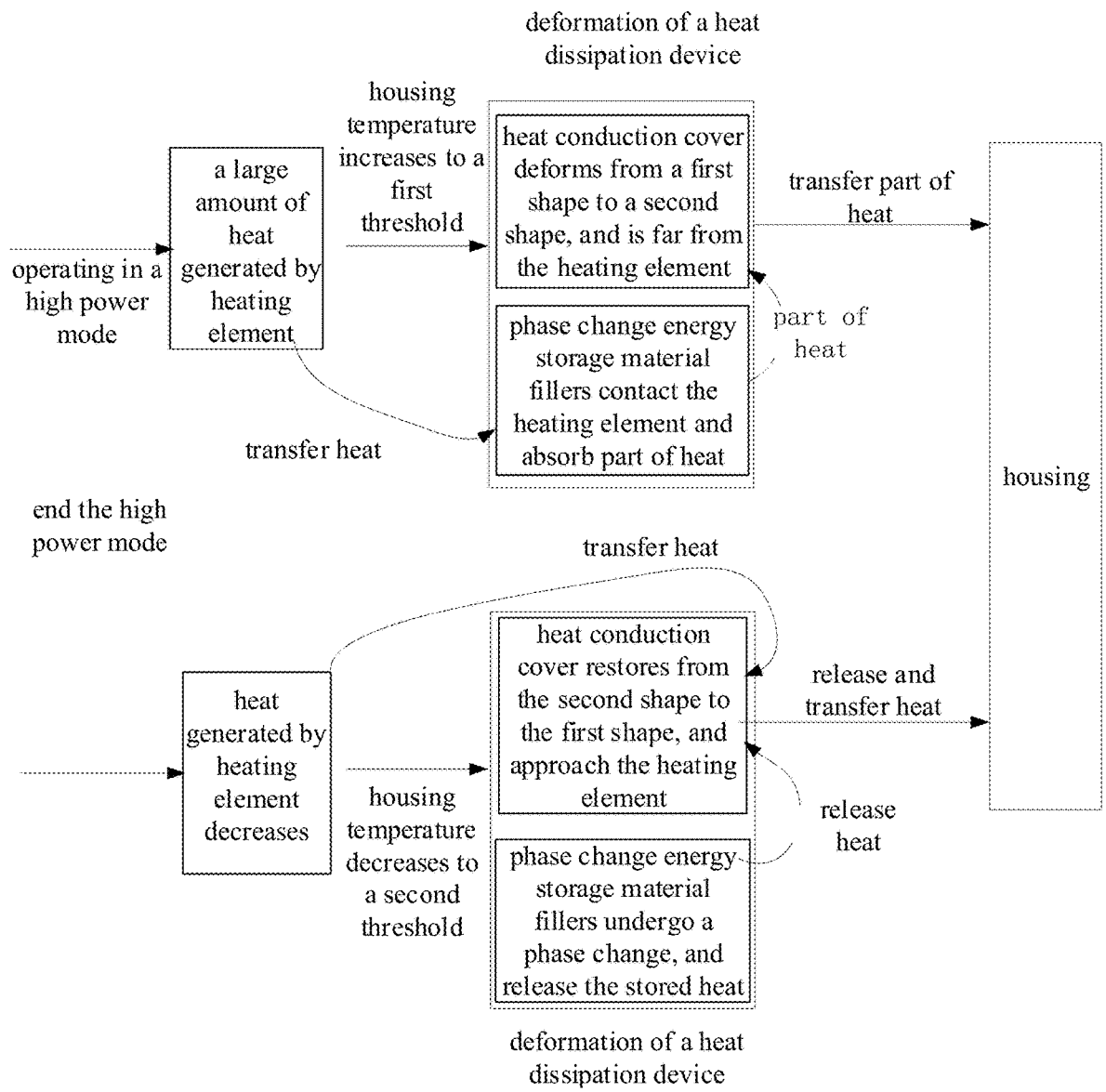
FIG. 7 illustrates a flowchart of another heat dissipation method consistent with the disclosed embodiments.

In certain embodiments, referring to the flowchart shown in FIG. 7, in practical applications, when the temperature change of the housing is that the temperature of the housing increases but does not reach the first threshold, the heat dissipation device of the electronic device maintains the first shape, and heat generated by the heating element of the electronic device is transferred to the electronic device housing for heat dissipation.

When the temperature change of the housing is that the temperature of the housing increases to a first threshold, the heat dissipation device of the electronic device is deformed from the first shape to the second shape. Correspondingly, by the deformed heat dissipation device, storing at least part of heat generated by the heating element of the electronic device includes: storing part of heat generated by the heating element of the electronic device by the heat dissipation device in the second shape, and transferring other part of heat generated by the heating element to the electronic device housing for heat dissipation;

When the temperature of the housing is changed from the first threshold to the second threshold, and the heat dissipation device is restored from the second shape to the first shape, the heat dissipation method further includes: releasing the stored heat by the heat dissipation device and transferring the stored heat to the electronic device housing for heat dissipation.

In the case that a large amount of heat is generated by the heating element of the electronic device, by means of the deformation of the heat conducting cover in the heat dissipation device and the phase change of the phase-change-energy-storage material filler, the heat transfer path is changed, such that heat generated by the heating element is no longer directly and fully transferred through the heat conducting cover to the housing, but is transferred to the heat conducting cover through the phase-change-energy-storage material fillers to the heat conducting cover. The phase-change-energy-storage material filler or other heat absorbing material filler stores part of heat, reducing heat transferred to the heat conducting cover, and avoiding the excessive housing temperature when the electronic device operates in a high-power mode.

After the electronic device ends the high-power mode, although heat generated by the heating element is reduced, and heat generated currently by the heating element that is transferred to the housing is reduced. But at this time, heat stored in the phase-change-energy-storage material fillers is released, such that the phase-change-energy-storage material fillers can undergo a phase change and restore the physical state under low temperature conditions. When the electronic device operates in a high-power mode again, the phase-change-energy-storage material fillers can continue to be used as heat storages to store partial heat generated by the heating element. At this time, the temperature of the housing is ensured not to be very high, and effective control of the housing temperature is realized.

Further, it should be noted that, with respect to each of the foregoing embodiments, relational terms such as first, second, and the like are only adopted to distinguish one operation, unit or module from another operation, unit or module. The relational terms do not necessarily require or imply any such actual relationship or order between the operations, units and modules. Furthermore, the terms "including", "comprising", or any other variation thereof are intended to cover a non-exclusive inclusion, such that a process, method or system that comprises a list of elements includes not only those elements, but also other elements not explicitly listed or inherent to such process, method or system. An element defined by the phrase "comprising a . . . " without further limitation does not exclude the presence of additional identical elements in the process, method or system that includes the element.

The various embodiments in this specification are described in a progressive manner, and each embodiment focuses on differences from other embodiments. The same or similar parts between the various embodiments may be referred to each other. For the electronic devices and methods disclosed in the embodiments, since they include or correspond to the heat dissipation device disclosed in the embodiments, the description is relatively simple, the relevant parts can be referred to the description of the electronic device.

The above description of the disclosed embodiments enables those skilled in the art to make or use the disclosure. Various modifications to these embodiments are obvious to those skilled in the art. The general principles defined herein may be implemented in other embodiments without departing from the spirit or scope of the disclosure. The present disclosure is not intended to be limited to the embodiments shown herein, but is to be accorded the broadest scope consistent with the principles and novel features disclosed herein.

What is claimed is:

1. A heat dissipation device, comprising:
   a heat conducting cover configured to be disposed in an electronic device, the heat conducting cover forming a closed cavity accommodating a heating element of the electronic device, the heat conducting cover comprising a heat conductive shape-memory material, the heat conducting cover configured to deform from a first shape to a second shape after a temperature increases to a first threshold, and configured to restore from the second shape to the first shape after the temperature decreases to a second threshold;
   a heat absorbing material filler located within the closed cavity as defined by the heat conducting cover,
   wherein, in response to a temperature increase, the heat absorbing material filler is configured to deform structurally, to absorb heat generated by the heating element.

2. The heat dissipation device according to claim 1, wherein:
   in response to the heat conducting cover being in the first shape, the heat absorbing material filler does not a contact the heating element of the electronic device; and
   in response to the heat conducting cover being in the second shape, the heat absorbing material filler contacts the heating element.

3. The heat dissipation device according to claim 2, wherein:
   in response to that the heat conducting cover is in the first shape, the heat conducting cover is in contact with a housing of the electronic device, and
   in response to that the heat conducting cover is in the second shape, there is a gap between the heat conducting cover and the housing of the electronic device.

4. The heat dissipation device according to claim 3, wherein: the first shape is a hollow concave shape, and a concave surface of the heat conducting cover faces the housing of the electronic device; the heating element is located at an intermediate position of the closed cavity of the heat conducting cover, and the heat absorbing material filler is located at both ends of the concave cavity of the heat conducting cover; and the second shape is a hollow rectangular shape, and the heat absorbing material filler is able to fill the closed cavity of the heat conducting cover.

5. The heat dissipation device according to claim 3, wherein: the heat absorbing material filler is a phase-change-energy-storage material filler; both a phase change temperature of the phase-change-energy-storage material filler and a deformation temperature of the heat conducting cover are greater than a high-power housing temperature of the electronic device, and the phase change temperature is not less than the deformation temperature; and the high-power housing temperature is a temperature of the housing of the electronic device when an operating power consumption of the electronic device is greater than a power consumption threshold.

6. The heat dissipation device according to claim 2, wherein:
   in response to that the heat conducting cover is in the first shape, the heat conducting cover is in contact with the heating element, and
   in response to that the heat conducting cover is in the second shape, there is a gap between the heat conducting cover and the heating element.

7. An electronic device, comprising:
   a housing;
   a heating element disposed within the housing; and
   a heat dissipation device disposed in the housing, wherein the heat dissipation device comprises:
   a heat conducting cover disposed on the heating element, the heat conducting cover forming a closed cavity accommodating the heating element of the electronic device, the heat conducting cover comprising a heat conductive shape-memory material, the heat conducting cover configured to deform from a first shape to a second shape after a temperature of the electronic device increases to a first threshold, and configured to restore from the second shape to the first shape after the temperature of the electronic device decreases to a second threshold; and
   a heat absorbing material filler located within the closed cavity as defined by the heat conducting cover,
   wherein, in response to an increase in temperature of the heating element, the heat absorbing material filler is configured to deform structurally, to absorb heat generated by the heating element.

8. The electronic device according to claim 7, wherein:
   in response to the heat conducting cover being in the first shape, the heat absorbing material filler does contact to the heating element; and
   in response to the heat conducting cover being in the second shape, the heat absorbing material filler contacts the heating element.

9. The electronic device according to claim 8, wherein:
   in response to that the heat conducting cover is in the first shape, the heat conducting cover is in contact with the housing of the electronic device, and in response to that the heat conducting cover is in the second shape, there is a gap between the heat conducting cover and the housing of the electronic device.

10. The electronic device according to claim 9, wherein: the first shape is a hollow concave shape, and a concave surface of the heat conducting cover faces the housing of the electronic device; the heating element is located at an intermediate position of the closed cavity of the heat conducting cover, and the heat absorbing material filler are located at both ends of the concave cavity of the heat conducting cover; and the second shape is a hollow rectangular shape, and the heat absorbing material filler is able to fill the closed cavity of the heat conducting cover.

11. The electronic device according to claim 8, wherein:
in response to that the heat conducting cover is in the first shape, the heat conducting cover is in contact with the heating element, and
in response to that the heat conducting cover is in the second shape, there is a gap between the heat conducting cover and the heating element.

12. The electronic device according to claim 8, wherein: the heat absorbing material filler is a phase-change-energy-storage material filler; both a phase change temperature of the phase-change-energy-storage material fillers and a deformation temperature of the heat conducting cover are greater than a high-power housing temperature of the electronic device, and the phase change temperature is not less than the deformation temperature; the high-power housing temperature is a temperature of the housing of the electronic device when an operating power consumption of the electronic device is greater than a power consumption threshold.

13. A heat dissipation method for an electronic device, comprising:
disposing a heat dissipating device in the electronic device, the heat dissipation device comprising:
a heat conducting cover disposed on a heating element of the electronic device, the heat conducting cover forming a closed cavity accommodating a heating element of the electronic device, the heat conducting cover comprising a heat conductive shape-memory material, the heat conducting cover configured to deform from a first shape to a second shape after a temperature of the electronic device increases to a first threshold, and configured to restore from the second shape to the first shape after the temperature of the electronic device decreases to a second threshold; and
a heat absorbing material filler located within the closed cavity as defined by the heat conducting cover,
wherein, the heat absorbing material filler deforms structurally, in response to heat generated by the heating element, to absorb the heat generated from the heating element.

14. The method according to claim 13, wherein:
after a temperature of the electronic device increases, but does not reach the first threshold, the heat conducting cover of the heat dissipation device maintains the first shape, and the heat generated by the electronic device is transferred to a housing of the electronic device for heat dissipation;
after the temperature of the electronic device increases to the first threshold, the heat conducting cover of the heat dissipation device deforms from the first shape to the second shape, and stores at least part of the heat generated by the electronic device.

15. The method according to claim 14, wherein:
the heat dissipation device in the second shape stores a part of the heat generated by the electronic device, and transfers another part of the heat to the housing for the heat dissipation;
after the temperature of the electronic device decreases from the first threshold to the second threshold, the heat conducting cover restores from the second shape to the first shape, and the heat dissipation device releases and transfers the stored heat to the housing for the heat dissipation.

16. The method according to claim 13, wherein:
in response to the heat conducting cover being in the first shape, the heat absorbing material filler does not contact the heating element of the electronic device, and
in response to the heat conducting cover being in the second shape, the heat absorbing material filler contacts the heating element.

* * * * *